United States Patent
Myoung et al.

(10) Patent No.: US 7,191,306 B2
(45) Date of Patent: Mar. 13, 2007

(54) FLASH MEMORY, AND FLASH MEMORY ACCESS METHOD AND APPARATUS

(75) Inventors: Sungju Myoung, Seoul (KR); Jaewook Cheong, Seoul (KR); Bumsoo Kim, Anyang (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 206 days.

(21) Appl. No.: 10/695,397

(22) Filed: Oct. 29, 2003

(65) Prior Publication Data

US 2004/0085849 A1    May 6, 2004

(30) Foreign Application Priority Data

Nov. 14, 2002  (KR)  .................... 10-2002-0070785

(51) Int. Cl.
*G06F 12/00* (2006.01)

(52) U.S. Cl. ...................... 711/203; 711/206
(58) Field of Classification Search ................ 711/203, 711/202, 206, 207, 205
See application file for complete search history.

(56) References Cited

U.S. PATENT DOCUMENTS

| | | | |
|---|---|---|---|
| 5,630,093 A * | 5/1997 | Holzhammer et al. ...... 711/115 |
| 6,038,639 A * | 3/2000 | O'Brien et al. ............. 711/114 |
| 6,587,915 B1 | 7/2003 | Kim | |
| 6,822,244 B2 * | 11/2004 | Beloussov et al. .......... 702/183 |
| 2003/0070035 A1 * | 4/2003 | Wang ......................... 711/103 |
| 2003/0093610 A1 * | 5/2003 | Lai et al. .................... 711/103 |
| 2004/0210706 A1 * | 10/2004 | In et al. ...................... 711/103 |

FOREIGN PATENT DOCUMENTS

| | | |
|---|---|---|
| KR | 10-031598 B1 | 10/1999 |
| KR | 2001-0028624 A | 4/2001 |
| KR | 2001-0029171 A | 4/2001 |

* cited by examiner

*Primary Examiner*—Pierre-Michel Bataille
(74) *Attorney, Agent, or Firm*—Sughrue Mion, PLLC

(57) ABSTRACT

A flash memory, and a flash memory access method and apparatus allowing memory access and error block recovery by creating a mapping table representing a physical address and status of a data block into a map block of the flash memory and referring to the mapping table. The flash memory includes a map block having a first mapping table containing a physical address allocated to each of blocks constituting a data block and status information of each of the blocks, a second mapping table containing mapping information between the physical address and a logical address on each of the blocks in the first mapping table from which error blocks are excluded, and a third mapping table in which most recent mapping information is written and processed by a specified value to minimize an update operation of the second mapping table.

22 Claims, 16 Drawing Sheets

| LBN | PBN |
|---|---|
| 0 | 1 |
| 1 | 4 |
| 2 | 0xFFFF |

BIT

| LBN | PBN |
|---|---|
| 0 | 0xFFFF |
| 1 | 0xFFFF |
| 2 | 0xFFFF |

| LBN | PBN |
|---|---|
| 0 | 1 |
| 1 | 4 |
| 2 | 56 |

→ LBN(1)=PBN(4)
Power cutoff

BIT

| LBN | PBN |
|---|---|
| 0 | 1 |
| 1 | 0xFFFF |
| 2 | 0xFFFF |

⋮

↓

TC spare

| LBN | PBN |
|---|---|
| 0 | 1 |
| 1 | 4 |
| 2 | 56 |

FLASH MEMORY, AND FLASH MEMORY ACCESS METHOD AND APPARATUS

This application claims the priority of Korean Patent Application No. 10-2002-0070785 filed Nov. 4, 2002, in the Korean Intellectual Property Office, the disclosure of which is incorporated herein in its entirety by reference.

BACKGROUND OF THE INVENTION

1. Field of the Invention

The present invention relates to a flash memory, a flash memory access method and apparatus. More particularly, the present invention relates to a flash memory, a flash memory access method and apparatus capable of allowing memory access and error block recovery to be made more efficiently by referring to a predetermined mapping table representing a physical address and status of a data block which is located in a block allocation map (hereinafter called 'map block') of the flash memory.

2. Description of the Prior Art

In general, flash memory has advantages of both RAM (random access memory) to and from which data is freely written and erased, and ROM (read only memory) capable of preserving stored data without the application of power. With these advantages, the flash memory has recently been widely used in storage media of portable electronic apparatus such as digital cameras, PDAs and MP3 players.

In such a flash memory, data stored at a specific location can be randomly accessed in the same manner as existing RAMs, nonvolatile storage devices, magnetic devices, or the like. However, when data are to be modified or erased, they are accessed in a block unit contrary to existing storage devices.

That is, if specific data stored in a flash memory are to be modified or erased, a data block containing the specific data should be removed and then the data should be written again. For example, it corresponds to a case where instead of modifying specific letters or characters one by one, a word containing the specific letters or characters is removed as a whole by pressing a 'delete' key and then it is entered again.

Among terms used herein, a 'block' represents a unit that can be erased at a time from a flash memory through a single erase operation, and a 'page' represents a size of data that can be read or written upon read/write operations.

A 'flash translation layer' (hereinafter, referred to as 'FTL') is software that allows a flash memory to be used as a block device. Generally, the FTL is a method for efficiently managing the flash memory and supports a block (or sector) re-mapping scheme.

A block (or sector) re-mapping scheme functions to manage mapping information on specific data between LBN and PBN so that even though a physical block number (hereinafter, referred to as 'PBN') of the data written onto a flash memory is changed due to modification or erasure of the data, the data written into the flash memory can be accessed using the same logical block number (hereinafter, referred to as 'LBN').

However, since the lifetime of a memory cell in a flash memory is not more than about 100,000 write cycles, the number of partial writes is limited.

Further, in a case where the supply of power is stopped during a write operation, there was a problem in that user's data being written or data for use in the remapping may be lost.

In the prior art, therefore, memory status information is written into the block and is then properly modified whenever the write operation is performed. In such a case, a storage space for storing the mapping information and time for managing the mapping information are required. Thus, there is a need for a more efficient processing method.

For example, in an NOR scheme FTL or a NAND scheme FTL of M-Systems currently commercialized, modified mapping information must be written using an additional replacement virtual page map (hereinafter, referred to as 'replacement VPM') whenever a write operation is performed. In such a case, there is a problem in that about 50% of a total flash memory is consumed since the replacement VPM must be employed in every data block.

Korean Patent No. 10-0319598 proposed for solving these problems in the prior art, which is entitled "Method and Apparatus for Accessing Flash Memory Array", discloses a technology capable of improving memory access efficiency by dividing the memory into block units and locating a lookup table at every divided block. However, there is a problem in that the storage space in the flash memory cannot be efficiently used since an additional lookup table must be provided at every block.

Further, Korean Patent Laid-Open Publication No. 2001-0029171 entitled "Flash Memory and Method of Controlling the Same" discloses a technology for allowing data to be efficiently written and updated by using a unit provided in the flash memory. The Korean Patent Laid-Open Publication No. 2001-0029171 does not disclose data mapping based on a unit comprised of a predetermined block but a re-mapping method for accessing block data more efficiently.

Furthermore, Korean Patent Laid-Open Publication No. 2002-0028624, entitled "Remapping Control Method for Flash Memory and Flash Memory Structure for Use Therein", discloses a technology for allowing the status of blocks and units to be written and processed while minimizing partial write. According to Korean Patent Laid-Open Publication No. 2002-0028624 mapping information between logical/physical block numbers written into a map block should be searched whenever a mapping relationship is changed due to delete, modify or a write operation, etc., by a host, in order to continuously update the mapping information about a corresponding block. Thus, since sufficient RAM capacity is required, the flash memory cannot be efficiently managed.

SUMMARY OF THE INVENTION

The present invention is conceived to solve the problems in the prior art. An object of the present invention is to efficiently access a physical address of a flash memory to be read or written by referring to a predetermined mapping table provided in a map block of the flash memory when a read or write operation is performed in the flash memory.

Another object of the present invention is to efficiently sense errors that occur due to an erroneous block in a flash memory and sudden power cutoff and to effectively perform data recovery.

A further object of the present invention is to provide a stable flash memory capable of allowing efficient memory access and error recovery to be made.

According to an aspect of the present invention, there is provided a flash memory comprising a map block. The map block includes a first mapping table containing a physical address allocated to each of blocks constituting a data block and status information of each of the blocks, a second mapping table containing mapping information between the physical address and a logical address on each of the blocks in the first mapping table from which error blocks are excluded, and a third mapping table in which most recent mapping information is written and processed by a specified value to minimize an update operation of the second mapping table.

In an exemplary embodiment, the flash memory the map block further comprises a spare block for each of the first, second and third mapping tables.

According another aspect of the present invention, there is provided a flash memory access apparatus which comprises a flash memory including a first mapping table, a second mapping table, a third mapping table and respective spare blocks thereof, wherein the first mapping table contains physical address information of a data block, the second mapping table contains mapping information of the first mapping table from which error blocks are excluded, and the third mapping table contains most recent mapping information; and a flash memory controller for generating a fourth mapping table containing free block information through the first, second and third mapping tables obtained from the map block in the flash memory, and for accessing respective physical addresses from and into which data will be read and written by referring to the second and third mapping table or the fourth mapping table upon read and write operations.

In an exemplary embodiment, the flash memory controller is configured to detect errors due to power cutoff during a data write process or mapping information update process through the second and third mapping tables or the fourth mapping table and to recover data related to the errors.

According to a further aspect of the present invention, there is provided a method for accessing a flash memory, which comprises the steps of receiving a logical address along with a command if read and write operations are requested by a processor; checking the logical address in a second mapping table containing mapping information, from which error blocks are excluded, of physical address information of a data block read from a flash memory and a third mapping table containing the most recent mapping information, in order to perform the read and write operations; and accessing the physical address of a specified data block and performing the read and write operations, when the logical address exists within the second and third mapping tables.

In an exemplary embodiment, the flash memory access method further comprises the step of treating the read operation as an error and accessing the physical address of a free block allocated through a fourth mapping table containing free block information created by a flash memory controller and performing the write operation, when the logical address does not exist within the second and third mapping tables.

In another exemplary embodiment, the flash memory access method further comprises the step of initializing the flash memory by loading the mapping information for efficiently accessing the flash memory from a map block of the flash memory according to the operations requested by the processor.

In addition, the flash memory access method may further comprise the step of detecting errors due to power cutoff occurring during the write operation process and recovering data related to the errors.

BRIEF DESCRIPTION OF THE DRAWINGS

The above and other objects, advantages and features of the present invention will become apparent from the following description of exemplary embodiments given in conjunction with the accompanying drawings, in which:

FIGS. 12a to 12c illustrate a process of recovering errors occurring in a mapping information update process according to one embodiment of the present invention, in the form of a mapping table.

DETAILED DESCRIPTION OF THE INVENTION

Hereinafter, a flash memory, and a flash memory access method and apparatus according to an exemplary embodiment of the present invention will be explained in detail with reference to the accompanying drawings.

In order to explain the constitution and operation of the present invention in connection with the exemplary embodiment of the present invention, the first to fourth mapping tables are defined as a physical address table (hereinafter, referred to as 'PAT'), a block information table (hereinafter, referred to as 'BIT'), a mapping information table (table cache; hereinafter, referred to as 'TC'), and an unused table (hereinafter, referred to as 'UT'), respectively; and a spare block for each of the mapping tables is defined as a spare (i.e., a PAT spare, a BIT spare and a TC spare).

First, the configuration of the flash memory, and the configuration and operation of a flash memory access apparatus according to the exemplary embodiment of the present invention will be explained in detail below with reference to the accompanying drawings.

Figure 1:
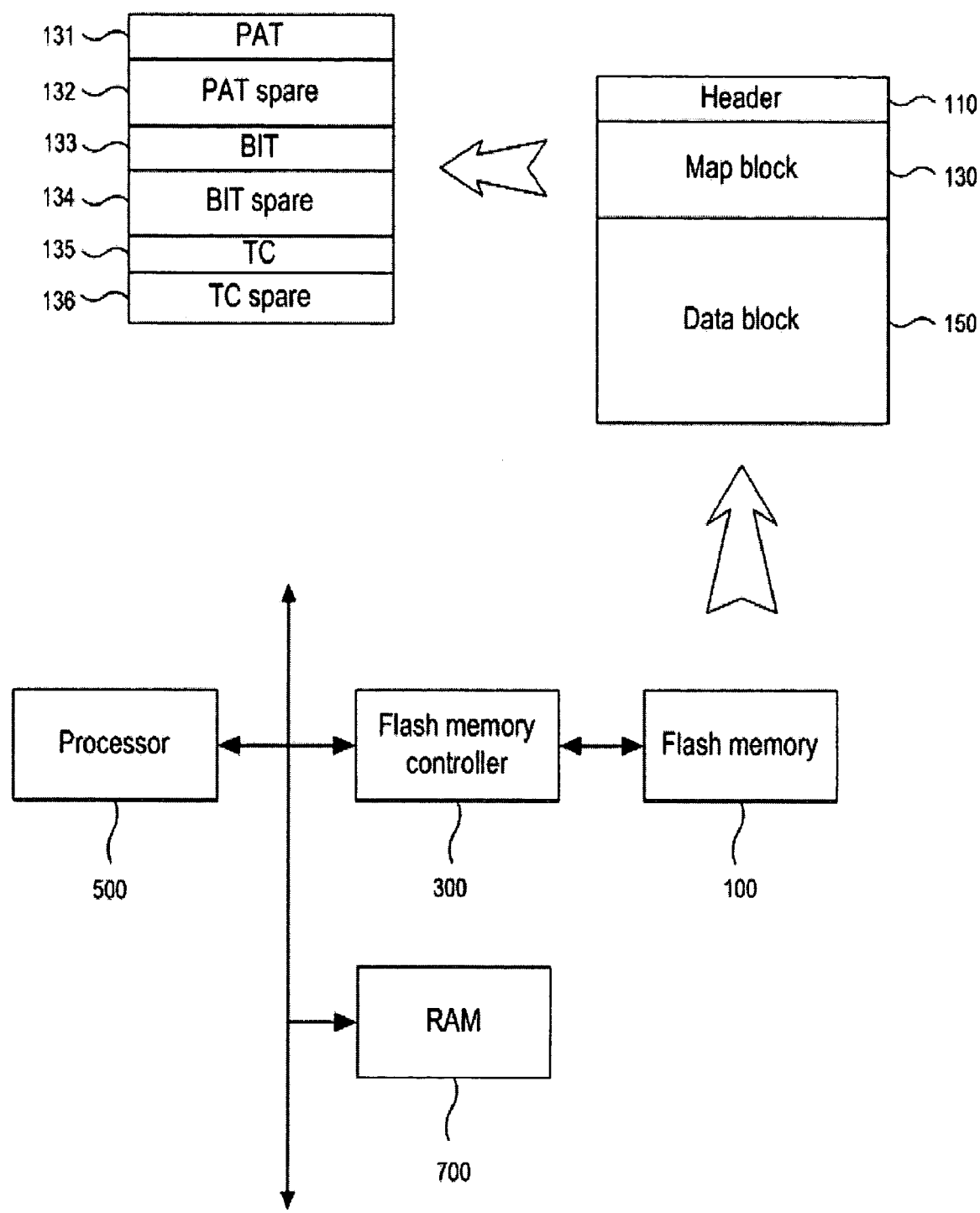
FIG. 1 shows a flash memory and a flash memory access apparatus thereof according to the present invention.

FIG. 1 shows the flash memory and the flash memory access apparatus thereof according to the present invention.

As shown in FIG. 1, the flash memory 100 comprises a header 110, a map block 130, and a data block 150.

General information on the flash memory such as a flash memory model, memory capacity and management information for the data block 150, and block information including PAT address information are stored in the header 110.

If the header 110 is provided with main firmware, data for initializing the flash memory is loaded much faster and a process of initializing the flash memory is efficiently executed.

Mapping information for performing read/write/erase operations through the data block 150 is written into the map block 130.

The data block 150 comprises a plurality of blocks that are divided into block units with a given size by a FTL so that they can be accessed according to the respective block units. Each of the blocks has a sequentially allocated PBN.

The structure of the map block 130 of the flash memory 100 according to the present invention, which is constructed as such and additionally shown in FIG. 1, will be explained in detail with reference to the accompanying drawings.

As shown in FIG. 1, the map block 130 comprises a PAT 131, a BIT 133, a TC 135; and a PAT spare 132, BIT spare 134 and a TC spare 136 which correspond to the spare blocks provided for writing update information of the mapping tables, respectively.

The PAT 131 is a mapping table that consists of information from multiple blocks constituting the data block 150, the PBN allocated to each of the multiple blocks, and status information on each of the blocks.

The PAT 131 is updated whenever an error block occurs. The updated contents are written into the next page of the page into which the current PAT is written. The fact that the contents have been changed is indicated in the previous page by using a code such as 0x00.

Further, PAT address information is changed whenever the contents are changed so that the PAT 131, which should be now used, can be confirmed in a process of initializing the flash memory. This PAT address information is written into the header 110.

The BIT 133 is a mapping table consisting of mapping information between LBN and PBN for each of the blocks of the PAT 131 from which error blocks are excluded.

Such a BIT 133 is to perform an efficient write operation. During the write operation requested from a processor 500, a flash memory controller 300 allows the BIT 133 to confirm empty blocks (hereinafter, referred to as 'free blocks') that can be written into and writes data into the free blocks. Thus, the write operation can be performed faster without searching the free blocks one by one from the data block.

Further, whenever new mapping information such as the PAT 131 is updated, the contents of the BIT are modified, the modified BIT is then written into the next page of the page into which the current BIT is written and a pointer indicating the BIT use region is also changed.

The TC 135 is a mapping table in which the most recent mapping information is written and processed up to a predetermined value in order to minimize the update operations of the BIT 133.

Such a TC 135 is to minimize a load produced by updating the BIT 133 whenever write/erase operations are performed. The TC 135 writes the most recent mapping information obtained during the write/erase operations requested by the processor 500, up to the predetermined value. If the mapping information reaches the predetermined value, the TC 135 updates the BIT 133, so that the update operation can be minimized since the BIT 133 need not be updated whenever write/erase operations are performed.

Furthermore, reduction in write speed due to the repetitive update operations of the BIT 133 can be prevented.

For example, in a case where the number of the mapping information written into the TC 135 is specified to three, the three mapping information written into the TC 135 is moved and written into the BIT 133 when the number of the mapping information written into the TC 135 becomes three during the write/erase operations requested by the processor 500.

The PAT spare 132, the BIT spare 134 and the TC spare 136 are provided to prevent a specific block of each of the PAT 131, the BIT 133 and the TC 135 from being used repetitively, respectively, during write/erase operations.

Specifically, the BIT spare 134 and the TC spare 136 store mapping information in the current BIT and TC to be updated in order to prepare against errors generated due to sudden power cutoff that occurs during the process of updating the mapping information of the BIT 133 and the TC 135 according to the write/erase operations.

For example, in a case where new mapping information obtained during the write operation process requested by the processor 500 is to be written into the TC 135, the mapping information in the TC 135 is moved and written into the BIT 133 after the previous mapping information written into the TC 135 reaches allocated storage capacity or the specified value.

In such a case, since the previous mapping information is written into the TC spare 136 before it is updated into the BIT 133, the flash memory controller 300 can confirm errors caused by the sudden power cutoff occurring during the process of writing the mapping information of the TC 135 into the BIT 133 and to process any error blocks.

Alternatively, if the previous mapping information written into the mapping information BIT 133 reaches the allocated storage capacity, the BIT mapping information is moved from a block of the BIT 133 to the next page and written into the next page.

In such a case, since the previous mapping information is written into BIT spare 134 before it is updated into the next page, the flash memory controller 300 can confirm the errors caused by the sudden power cutoff occurring during the process of writing the mapping information of the BIT 133 into the next page and to process any error blocks.

As shown in FIG. 1, The flash memory access apparatus for efficiently accessing the flash memory 100 through the flash memory 100 constructed as such whenever read/write operations requested by the processor 500 are performed, generally comprises the flash memory 100 and the flash memory controller 300. In order to implement an exemplary embodiment of the present invention, the flash memory access apparatus further comprises the processor 500 and a RAM 700.

The flash memory controller 300 of the present invention generates the UT 137 by using the PAT 131, the BIT 133 and the TC 135 consisting of a physical address and mapping information on the data block 150 that are obtained from the map block 130 of the flash memory 100. Further, the flash memory controller 300 accesses a physical address, on which data will be read or written, by referring to the BIT 133/TC 135 or the UT 137 upon processing read/write operations.

The processor 500 generates a control command for reading data written into the flash memory 100 or writing data into the flash memory 100 and transmits the generated command to the flash memory controller 300. The RAM 700 stores the data obtained during the process of accessing the flash memory 100 by means of the processor 500 and the flash memory controller 300.

Figure 2:
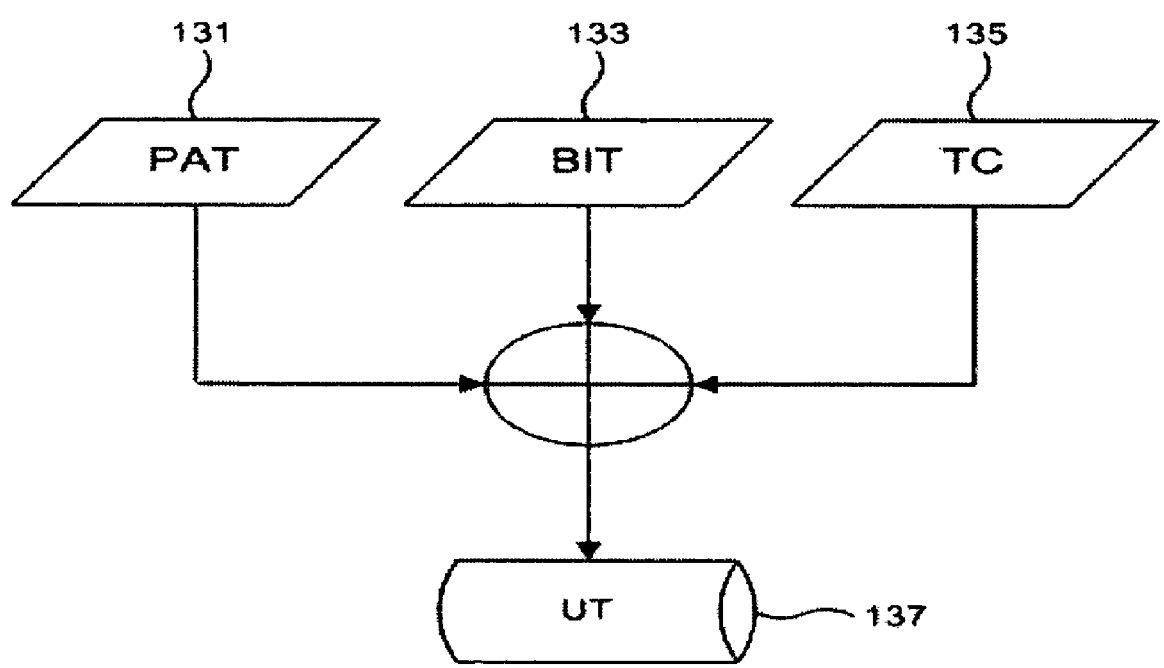
FIG. 2 illustrates a logical sum for generating UT in a flash memory controller.

The UT 137 generated by the flash memory controller 300 causes the PAT 131, the BIT 133 and the TC 135 to be logically summed, as shown in FIG. 2. The UT 137 consists of the PAT 131 to which the mapping information written into the BIT 133 and the TC 135 is added.

The UT 137 generated as such is stored in the RAM 700 from which the data can be read relatively faster by the flash memory controller 300 so that a fast search of free blocks can be made faster during the write operation. Accordingly, contrary to the PAT 131, the BIT 133 and the TC 135 being written into the flash memory 100, the UT 137 is generated by the flash memory controller 300 whenever the flash memory 100 is initialized.

The PAT 131, the BIT 133, the TC 135 and the UT 137 employed in the flash memory 100 and the flash memory access apparatus of the present invention constructed as such are explained in detail with reference to the accompanying drawings.

Figure 3A:
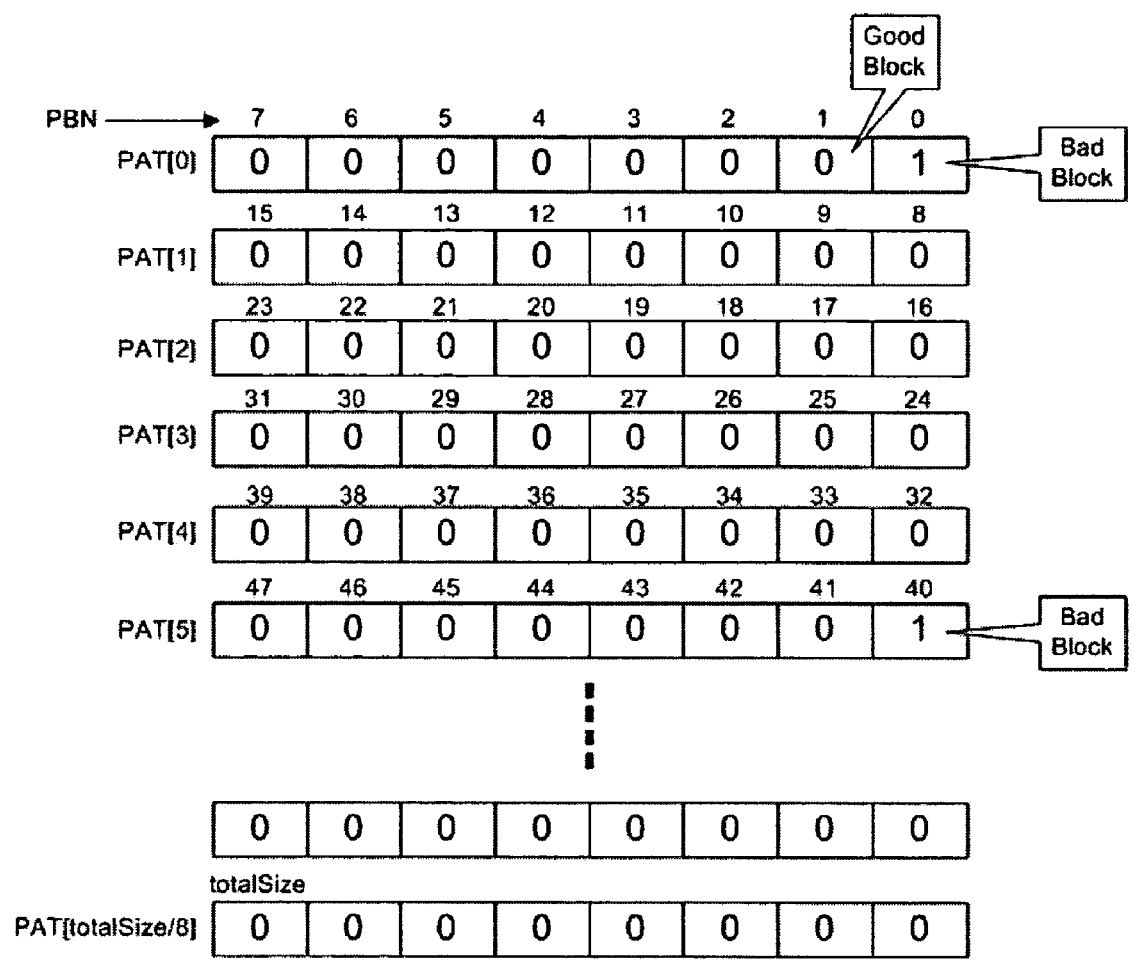
FIGS. 3a to 3c show exemplary mapping tables for PAT, BIT, TC and UT according to the present invention.
Figure 3B:
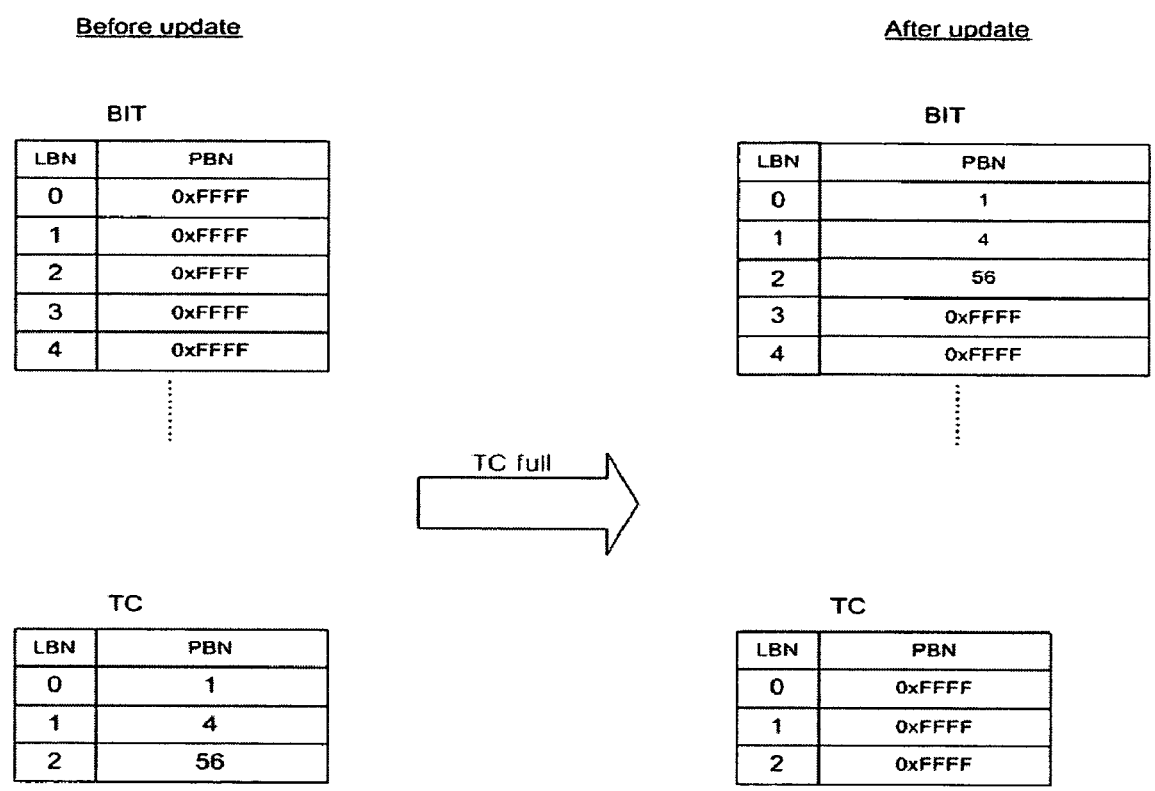
Figure 3C:
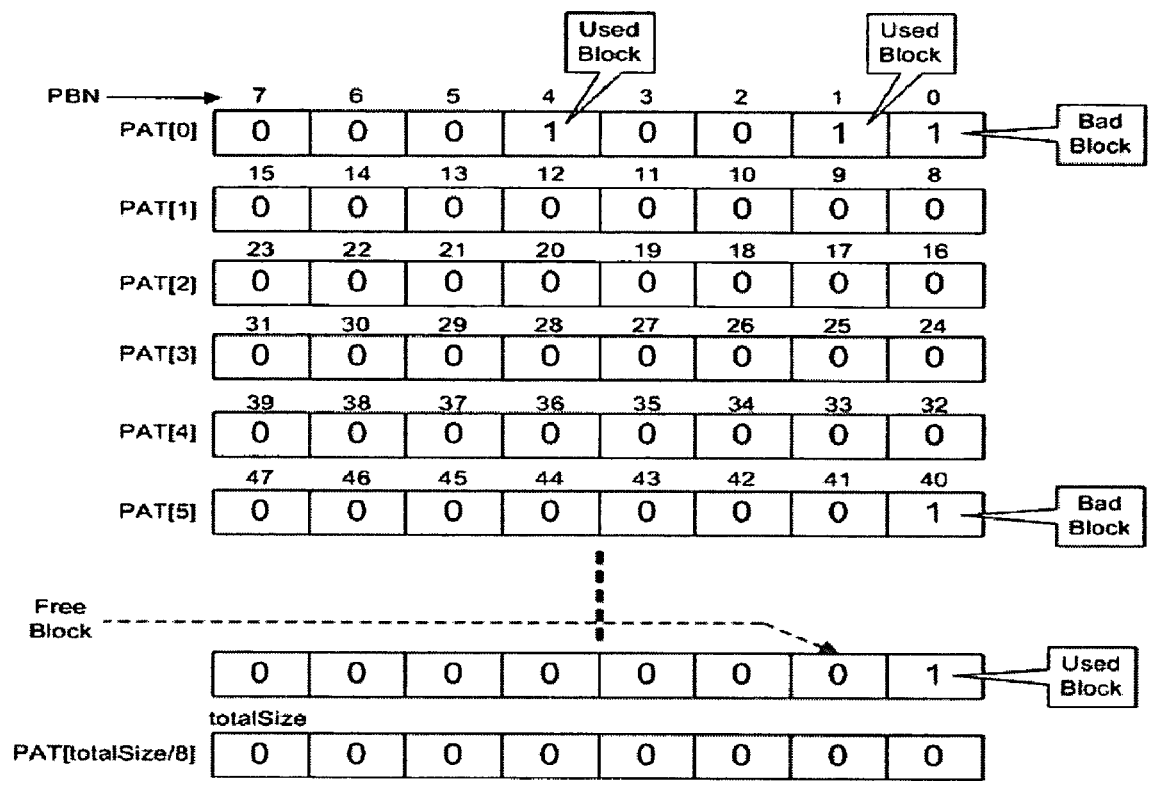

FIGS. 3a to 3c exemplifies the mapping tables for the PAT 131, the BIT 133, the TC 135 and the UT 137.

As shown in FIG. 3a, the PAT 131 represents the physical address information of the data block 150. More specifically, the PAT 131 comprises PBNs that are sequentially allocated to each of the multiple blocks that are divided into blocks with a predetermined size by a FTL; and status information written into each of the blocks.

The status information of each of the blocks is comprised of '0' indicating a good block and '1' indicating a bad block.

As shown in FIG. 3b, the BIT 133 represents use information of the blocks in the data block 150. More specifically, the BIT 133 is comprised of the mapping information between the LBN and PBN for each of the blocks in the PAT 131 from which the error blocks are excluded.

That is, as shown in the figure, a specific PBN mapped to the LBN for which the write operation is required by the processor 500 and the predetermined code (for example, 0xFFFF) representing an unused LBN are written.

As shown in FIG. 3b, the TC 135 is comprised of the most recent mapping information generated by processing the write operation requested by the processor 500.

The mapping information of the TC 135 is updated into the BIT 133 if it is written up to the predetermined value since the mapping information to be written is limited.

For example, in a case where the number of the mapping information written into the TC 135 is specified to three, if the number of the mapping information written into the TC 135 through write/erase operations by the processor 500 reaches three, the three mapping information written into the TC 135 is moved and written into the BIT 133.

Accordingly, since the BIT 133 is updated to the next page only when the mapping information is moved from the TC 135, the update operation can be minimized even though the mapping information is not updated whenever the write/erase operations are performed.

Further, the LBN and PBN are not mapped one to one in the BIT 133 and the TC 135. Instead, through a stepwise mapping scheme, if the processor 500 requests data to be written, the data input by allocating a given free block to a block into which data will be written are written into the BIT and TC, and a physical block address to which a logical block address requested by the processor 500 is mapped is stored in the BIT and TC.

Referring to FIG. 3b, the process of updating the mapping information between the BIT 133 and the TC 135 will be described in detail.

If the flash memory is in an initial state (before update), the BIT 133 and the TC 135 consist of the LBN of an unused status (0xFFFF). At the initial state, whenever the write operation is requested from the processor 500, the mapping information between new LBN and PBN is sequentially written into the TC 135.

For example, a value of '1' corresponding to the PBN into which the data input from the processor 500 is written is written into a first LBN(0) of the TC 135. At this time, a value of '1' corresponds to the physical block information to which the logical block address requested by the processor 500 is mapped.

As such, a value of '4' corresponding to the PBN into which data input from the processor 500 is written, is written into a second LBN(1) of the TC 135. A value of '56' corresponding to the PBN into which data input from the processor 500 is written is written into a third LBN(2) of the TC 135.

If the number of the mapping information that can be stored in the TC 135 is specified to three, the mapping information of the TC 135 is updated into the BIT 133 since the mapping information of the TC 135 reached the specified number.

Accordingly, the respective LBNs corresponding to the mapping information updated from the TC 135 are written into the BIT 133. That is, the PBNs corresponding to the LBNs are written into the BIT 133, and the mapping information in the TC 135 is deleted (after update).

As shown in FIG. 3c, the UT 137 represents usable block information of the block units in the data block 150 and includes the PAT 131 to which the mapping information of the BIT 133 and the TC 135 is added.

The UT 137 provides free blocks into which data will be written according to the write operation requested by the processor 500. A first free block is indicated by a pointer so that the free blocks can be more efficiently accessed.

A method of accessing the flash memory using the flash memory access apparatus according to an exemplary embodiment of the present invention will be described in detail with reference to the accompanying drawings.

A process of initializing the flash memory 100 through the flash memory controller 300 will be first explained and a process of performing read/write operations requested by the processor 500 in the initialized flash memory 100 will be then explained.

1. Initialization Process

The initialization process is to load the mapping information for efficiently accessing the flash memory 100 according to the operation requested by the processor 500.

Figure 4:
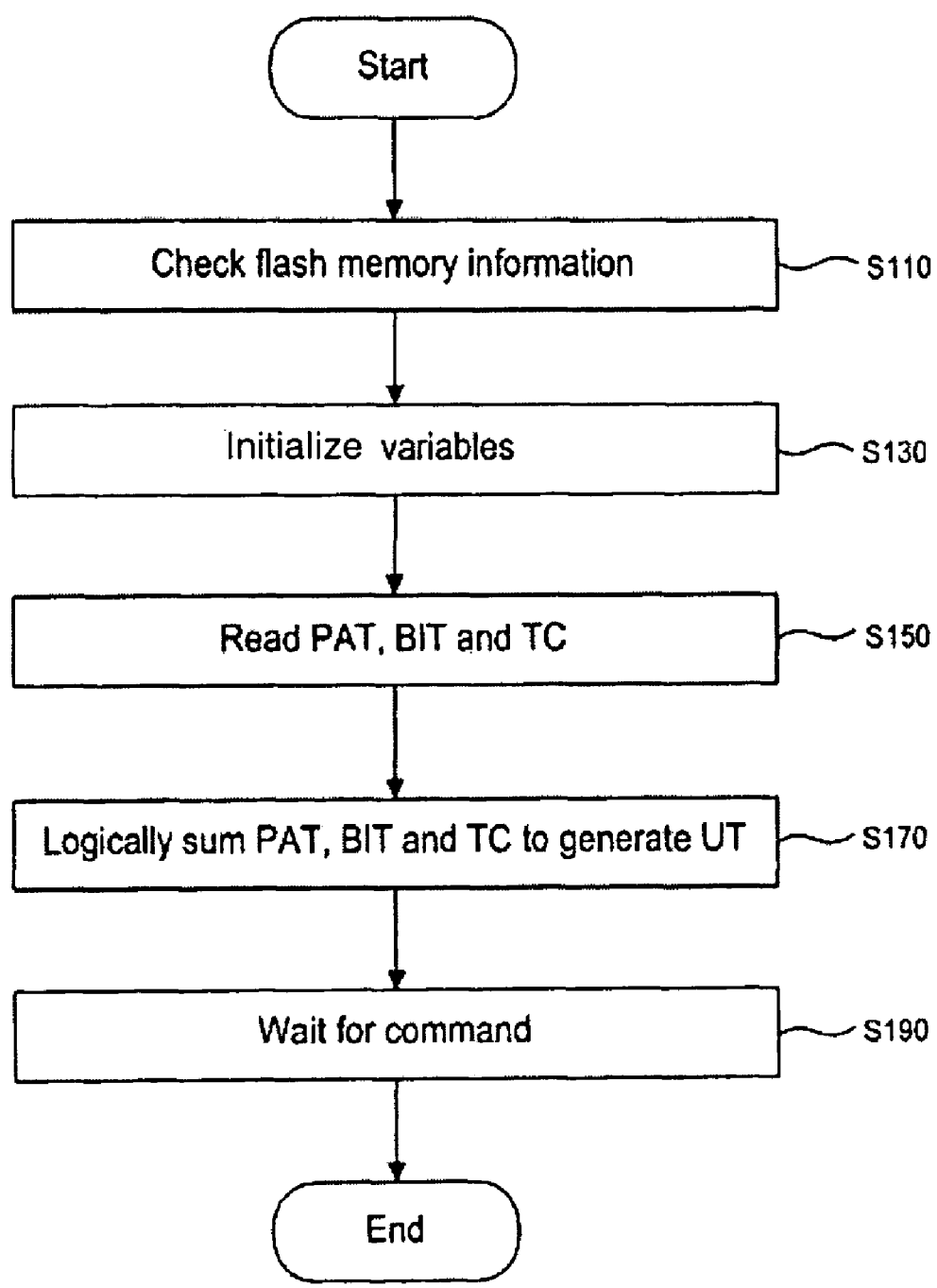
FIG. 4 is a flowchart illustrating a process of initializing the flash memory according to a flash memory access method of the present invention.
Figure 5:
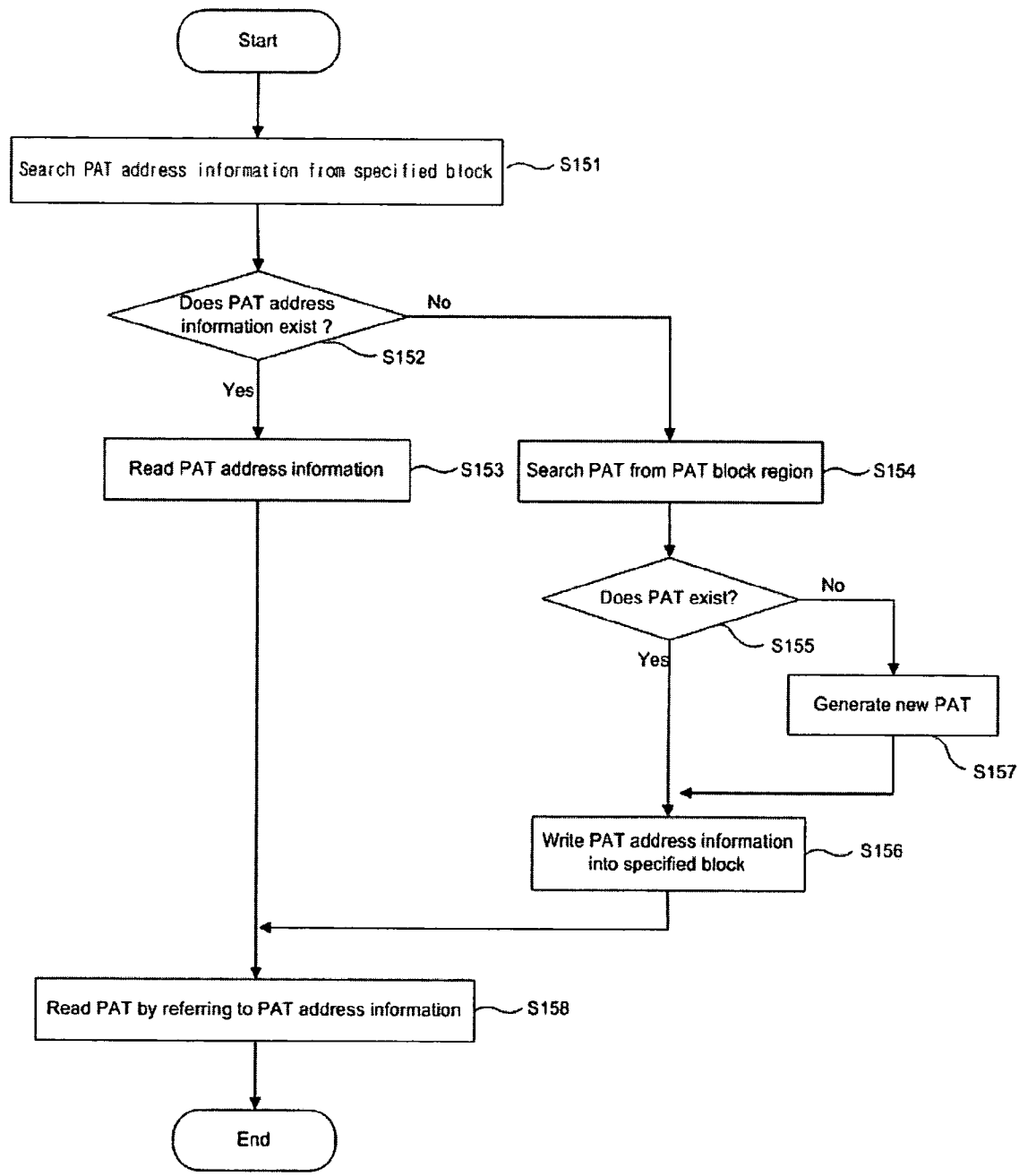
FIG. 5 is a flowchart illustrating a process of reading out the PAT in step S150 shown in FIG. 4.

FIG. 4 shows a flowchart illustrating the initialization process for the flash memory according to the present invention, and FIG. 5 illustrates in detail a read process for the PAT 131 shown in FIG. 4.

As shown in FIG. 4, flash memory information such as address information of a block into which the entire information on the flash memory and PAT address information, which are written into the header 110 of the flash memory 100, are written is checked in the flash memory controller 300 (S110). Then, variables for reading the PAT 131, the BIT 133 and the TC 135, which are written into the map block 130 of the flash memory 100, are initialized (S130).

Next, a block at which a PAT to be used among the PAT block region allocated to the map block 130 of the flash memory 100 is searched using the PAT address information obtained from a specific block of the header 110. The PAT 131 written into the searched block is then read.

Further, all the blocks in the BIT and TC block regions allocated to the map block 130 of the flash memory 100 are searched to read the BIT 133 and TC 135 (S150).

As such, if the PAT 131, the BIT 133 and the TC 135 are read, the read PAT 131, BIT 133 and TC 135 are logically summed to generate the UT 137 in the flash memory controller 300. The generated UT 137 is then stored in the RAM 700 (S170).

After such an initialization process has been completed, the process waits to perform read or write operations requested by the processor 500 (S190).

In the initialization process, step S130 of reading the PAT 131 will be explained in detail with reference to FIG. 5.

As shown in FIG. 5, in step S110 of checking the flash information, the PAT address information is searched from a specified block of the blocks in the header 110 by using the address information on the blocks into which PAT the address information obtained from the header 110 is written (S151).

Then, it is determined through the search result whether the PAT address information exists (S152). As the result of the determination, if the PAT address information exists, the searched PAT address information is read (S153). Otherwise, the PAT is searched from all the blocks in the PAT block regions allocated to the map region 130 (S154).

Next, it is determined through the PAT search result for all the blocks in the PAT block region whether the PAT exists within the PAT block region (S155). As the result of the determination, if the PAT 131 exists, the address information on the block for which the PAT 131 is searched is written into the specified block of the header 110 as the PAT address information (S 156).

On the contrary, if the PAT 131 does not exist, the PBNs are allocated to the respective blocks of the data block 150 and the status of each PBN is then searched to generate a new PAT 131 (S157). Next, the generated PAT 131 is written into a specific block of the PAT block region, and the block address into which the PAT 131 is written is then written into the specified block of the header 110 as the PAT address information (S156).

If the PAT address information is generated or read through these processes, the flash memory controller 300 causes the PAT 131 to be read from the PAT block region using the read PAT address information (S158).

2. Read Operation Process

The read operation process is to search a corresponding physical address in the data block 150 of the flash memory 100 and to provide the written data to the processor 500, if a logical address is received along with a read command when a read operation for given data is requested by the processor 500.

Figure 6:
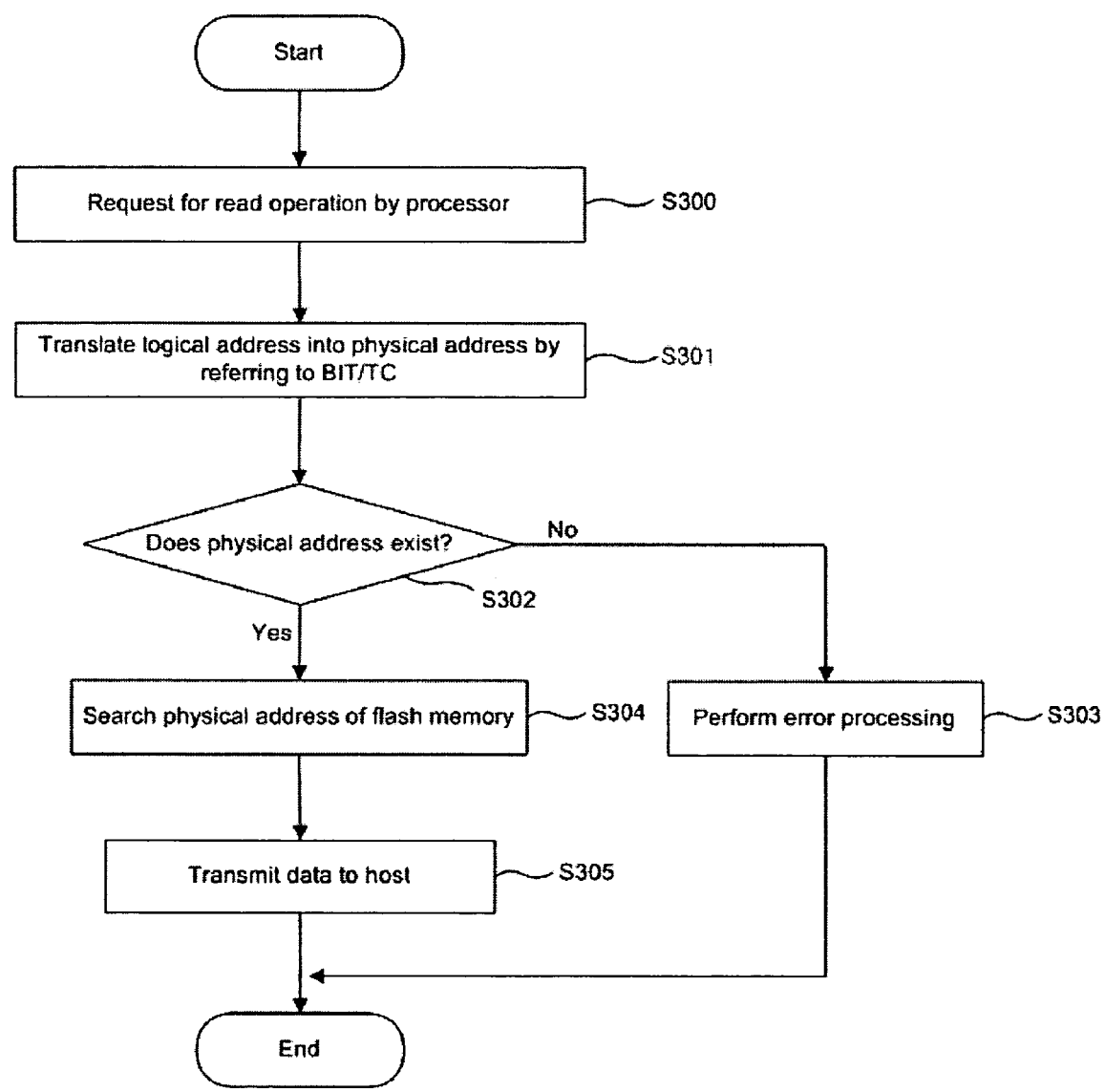
FIG. 6 is a flowchart illustrating a process of performing a read operation according to the flash memory access method of the present invention.

FIG. 6 shows a flowchart of the read operation process according to the flash memory access method of the present invention.

As shown in FIG. 6, if a given logical block address corresponding to a logical address of the corresponding data is received along with the request for a read operation from the processor 500 (S300), the input logical block address is translated to a physical block address of the flash memory 100 within the flash memory controller 300 by referring to the BIT 133 and the TC 135 (S301).

If the logical address is translated to the physical address in such a manner, it is determined whether the translated physical address exists within the physical address range of the data block 150 (S302), in order to confirm whether the logical address for which the read operation is requested by the processor 500 actually exists through the translated physical address. As the result of the determination, if the translated physical address does not exist within the physical address range, a message containing a determination error code is transmitted to the processor 500 and error processing is then performed (S303).

On the contrary, if the translated physical address exists within the physical address range, a corresponding physical address is searched in the data block 150 of the flash memory 100 using the translated physical address (S304). Then, data written into the searched physical address are read from the data block 150 and then transmitted to the processor 500 (S305).

3. Write Operation Process

The write operation process is to determine a first free block or a physical address allocated by the stepwise mapping scheme as a block to be written and to write a logical address and the physical address into the TC 135 as the mapping information depending on the write operation, if the logical address is received along with a write command when the write operation for given data is requested by the processor 500.

The write operation may be largely divided into the following cases, depending on the status of the map block 130 or the data block 150: a case where there are almost no items to be considered, a case where the storage capacity of the TC 135 is insufficient due to the mapping information written into the TC block region allocated to the map block 130, a case where the storage capacity of the TC 135 and the BIT 133 is insufficient, and a case where previously written data existing in the logical address for which the write operation is required are to be modified or added.

The write operation process for a case where there are almost no items to be considered will be first described, and the other write operation processes will then be sequentially explained.

Figure 7:
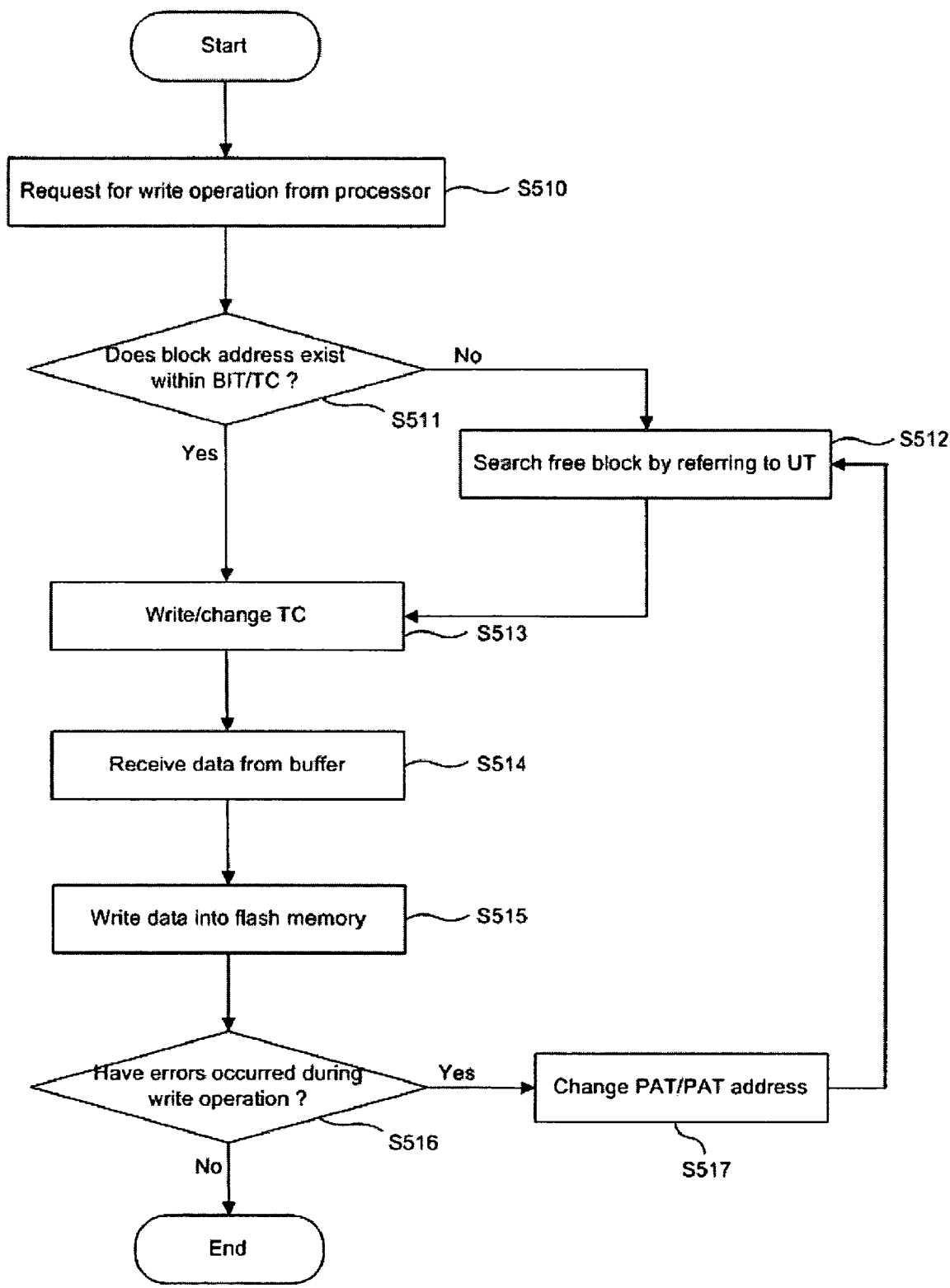
FIG. 7 is a flowchart illustrating a process of performing a write operation according to the flash memory access method of the present invention.

FIG. 7 is a flowchart illustrating only the pure write operation process according to the flash memory access method of the present invention.

As shown in FIG. 7, if the write operation is requested by the processor 500 and a given logical block address is input (S510), it is determined in the flash memory controller 300 whether the corresponding block address exists within the BIT 133 and the TC 135 through the input logical block address (S511).

As the result of the determination, if the logical block address does not exist within the BIT 133 and the TC 135, a first writable free block indicated by a pointer is searched for by referring to the UT 137 (S512). On the contrary, if the logical block address exists within the BIT 133 and the TC 135, an arbitrary block allocated by the stepwise mapping scheme is selected as a block into which data will be written.

Through the above process, the mapping information between the physical address corresponding to either the first free block selected as the block into which the data will be written or the given block allocated by the stepwise mapping scheme and the logical address for which the write operation is requested by the processor 500, is written into the TC 135 (S513). Further, the pointer of the TC 135 indicating the use region, which is changed by the newly written mapping information, is changed (S513).

For example, in a case where the logical address for which the write operation is requested by the processor 500 does not exist within the BIT 131 and the TC 135, the flash memory controller 300 calls a function defined as follows, in order to use the first free block of the UT 137 as the block into which the data will be written:

Get_Free_Block( )
Return value is this block number
This Block is the first unused block at UT As the function is called, the first free block indicated by the pointer in the UT 137 shown in FIG. 3c is searched.

As such, if the block into which the data will be written is determined and the mapping information of the TC 135 is changed, data are input through a buffer from the processor 500 (S514).

If the data input is finished, the flash memory controller 300 causes the input data to be written into the physical address that has been determined as the block, into which the data will be written, among the data blocks 150 in the flash memory 100 (S515).

While the data is written through the above process, the flash memory controller 300 determines whether errors occur due to sudden power cutoff (S516). The data write operation will be finished if no errors occurred. Otherwise, the block into which data are written is assigned as an error block, and the error block is then written into the PAT 131, and the changed PAT 131 is finally written into the page next to the page into which the current PAT is written (S517).

Then, the PAT address information changed by the error block is written into the header 110. In order to complete the data write operation, the process returns to a routine where the first free block into which the data will be written is searched for by referring to the UT 137 (S517).

Figure 8:
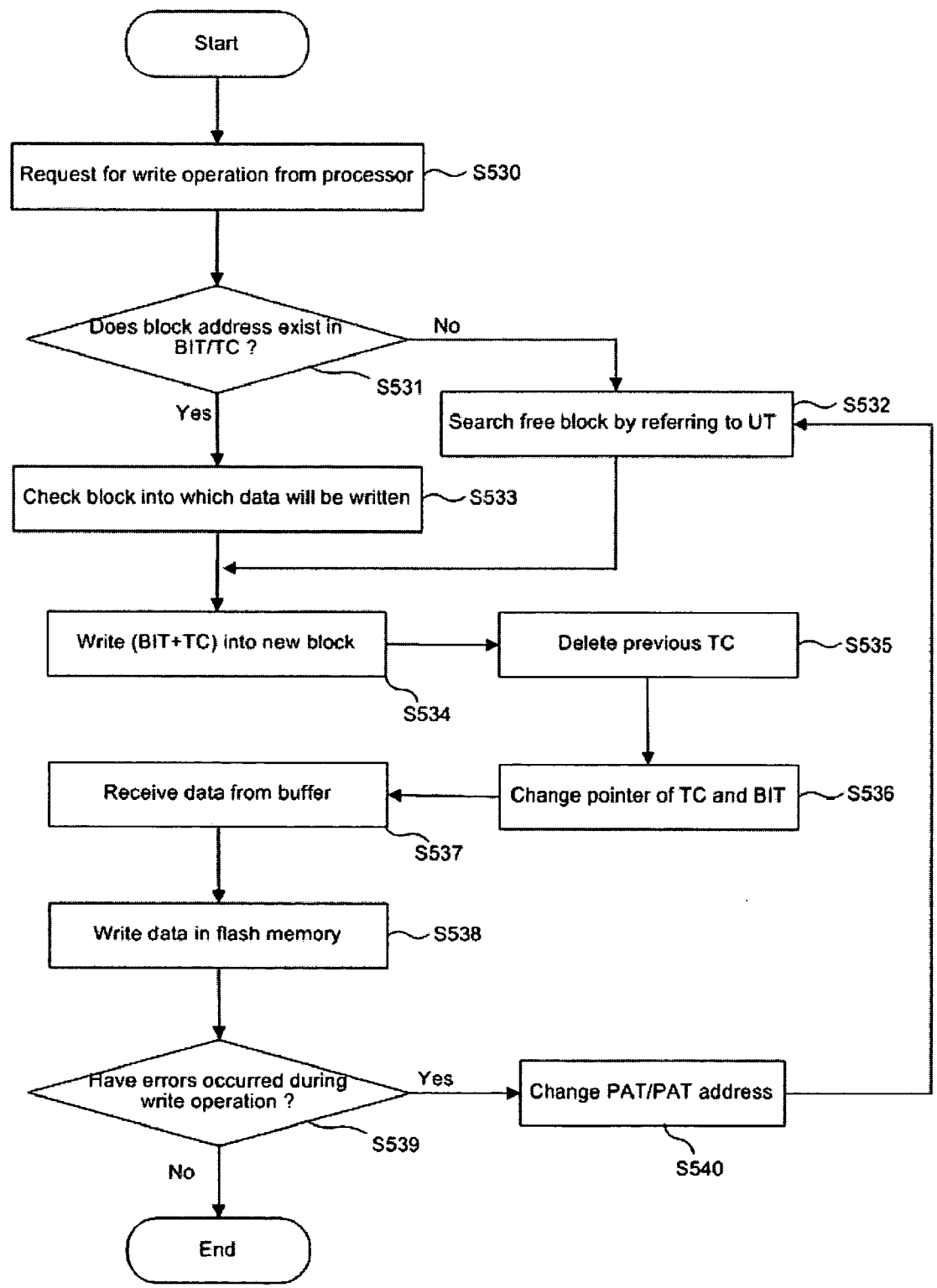
FIG. 8 is a flowchart illustrating the process of performing a write operation, in a case where capacity of the TC is insufficient, according to the flash memory access method of the present invention.

FIG. 8 is a flowchart of the write operation process according to the flash memory access method of the present invention that is performed in the case where the capacity of the TC 135 is insufficient.

The write operation process when the capacity of the TC 135 is insufficient is similar to the general write operation process shown in FIG. 7. For simplicity of explanation, overlapping explanation thereof will be omitted.

As shown in FIG. 8, if a write operation is required from the processor 500, a given logical block address is first received along with a corresponding command (S530).

Next, in the flash memory controller 300, it is determined whether the input logical address exists within the BIT 133 and the TC 135 (S531). If the determination result is no, the first usable free block is searched for by referring to the UT 137 (S532), or if the determination result is yes, block allocated by the stepwise mapping scheme is checked (S533).

If the first usable free block or the block allocated by the stepwise mapping scheme is determined as a block into which the data will be written through the above process, the corresponding mapping information is written into the TC 135.

However, since the storage capacity of the TC 135 is insufficient, a new block of the BIT block region of the map block 130 is allocated. Then, the BIT 133 changed to the mapping information that is updated by the TC 135 is written into the new block (S534), and the previous TC 135 is also deleted (S535).

As such, since the updated BIT 133 is written into the newly allocated block and the previous TC block is deleted, the blocks of the BIT 133 and the TC 135 are changed. Thus, the pointers of the BIT 133 and the TC 135 indicating the use regions in the BIT or TC block region are changed (S536).

After the pointers of the BIT 133 and the TC 135 are changed, the flash memory controller 300 causes the data transmitted from the processor 500 in response to the write operation to be input into a buffer (S537) and the input data to be written into the physical address of a specified flash memory 100 (S538).

Further, it is determined whether errors have occurred during the data write operation (S539). If errors have occurred, the block into which data were being written is specified as an error block, and the error block is then written into the PAT 131, and the changed PAT 131 is finally written into the page next to the page into which the current PAT is written (S540).

Thereafter, the PAT address information changed by the error block is written into the header 110. In order to complete the data write operation, the process returns to a routine where the first free block into which the data will be written is searched for by referring to the UT 137 (S540).

Figure 9:
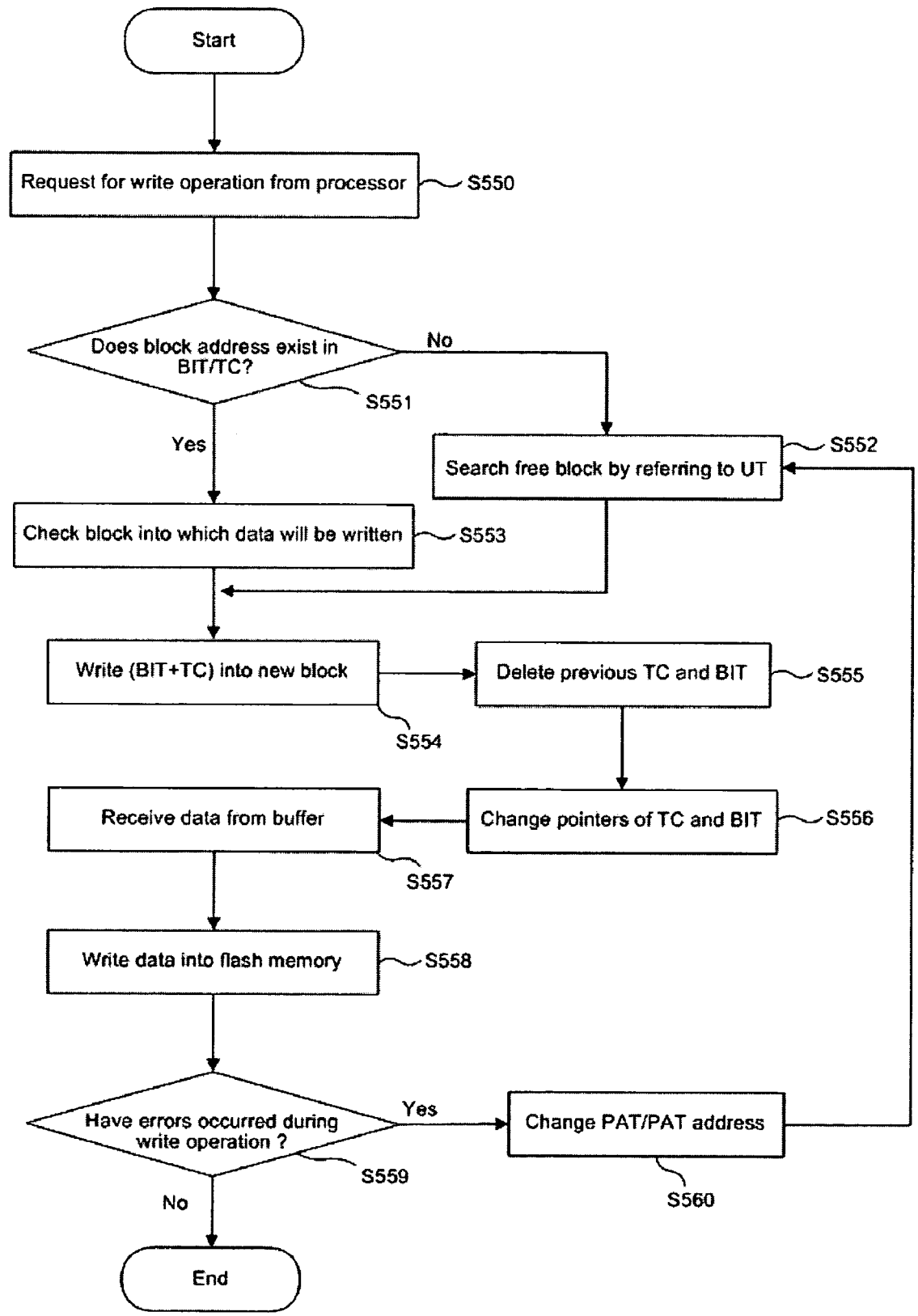
FIG. 9 is a flowchart illustrating the process of performing a write operation, in a case where capacities of the BIT and the TC are insufficient, according to the flash memory access method of the present invention.

FIG. 9 is a flowchart of the write operation process according to the flash memory access method of the present invention that is performed in the case where the capacities of the BIT 313 and the TC 315 are insufficient.

The write operation process when the capacities of the BIT 313 and the TC 135 are insufficient is similar to the write operation process performed when the capacity of the TC 135 shown in FIG. 8. Thus, overlapping explanation thereof will be omitted.

As shown in FIG. 9, if the write operation is requested by the processor 500, a given logical block address is first received along with a corresponding command (S550).

Next, in the flash memory controller 300, it is determined whether the input logical address exists within the BIT 133 and the TC 135 (S551). If the input logical address does not exist, the first usable free block is searched for by referring to the UT 137 (S552), or if the input logical address does exist, the block allocated by the stepwise mapping scheme is checked (S553).

If the first usable free block or the block allocated by the stepwise mapping scheme is a block into which the data will be written through the above process, the corresponding mapping information is written into the TC 135.

However, since the storage capacities of the BIT 133 and the TC 135 are insufficient, a new block of the BIT block region is allocated. Then, the BIT 133 in which the mapping information of the TC 135 is updated is written into the new block (S554), and the previous BIT 135 and TC 135 are deleted (S555).

As such, since the updated BIT 133 is written into the newly allocated block and the previous BIT 133 and the TC 135 are deleted, the blocks of the BIT 133 and the TC 135 are changed. Thus, the pointers of the BIT 133 and the TC 135 indicating the use regions in the BIT or TC block region are changed (S556).

After the mapping information of the BIT 133 and the TC 135 is changed, the data are input into a buffer from the processor 500 (S557), and are written into the data block of the flash memory 100 corresponding to a selected physical address (S558).

Also, it is determined whether errors have occurred during the data write operation (S559). If errors have occurred, the block into which data are written is specified as an error block and then written into the PAT 131. Next, the changed PAT 131 is written into the next page into which the current PAT is written, and PAT address information changed accordingly is then written into the header 110 (S560).

Also, in order to complete the data write operation, the process returns to a routine where the first free block into which the data will be written is searched for by referring to the UT 137 (S552).

Figure 10:
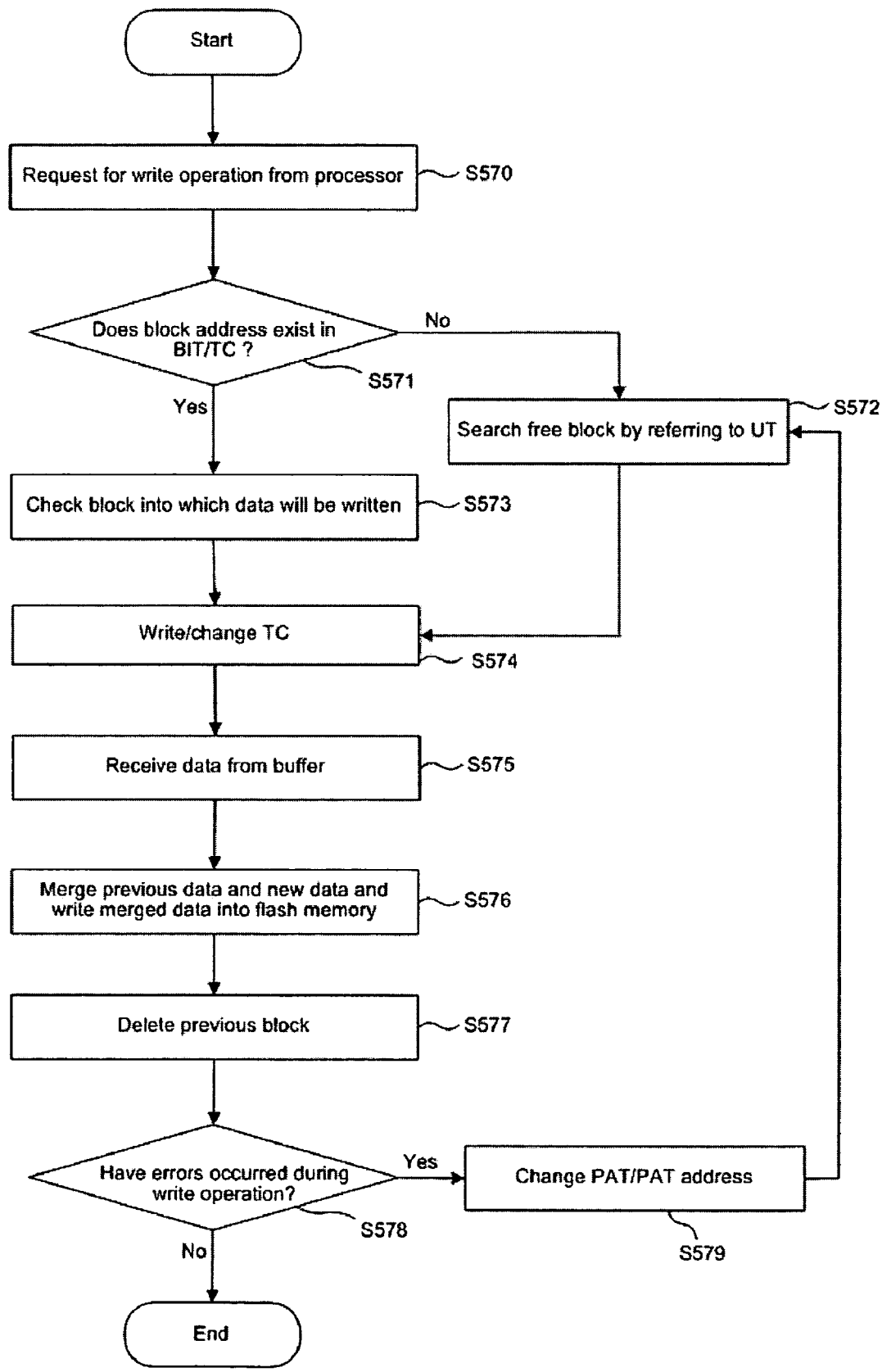
FIG. 10 is a flowchart illustrating the process of performing a write operation, in a case where already written data are modified or added to, according to the flash memory access method of the present invention.

FIG. 10 is a flowchart of the write operation process according to the flash memory access method of the present invention that is performed in the case where the previous written data are modified or added.

The write operation process for modifying or adding the data is similar to the write operation process shown in FIG. 7. Thus, an overlapping explanations thereof will be omitted.

As shown in FIG. 10, the flash memory controller 300 determines a block into which data will be written, and then causes the mapping information changed accordingly to be written into the TC 135.

Next, data transmitted from the processor 500 are received from a buffer (S575). The input data and the previously written data are merged, and the merged data are then written into a specified physical address of the data block 150 in the flash memory 100 (S576).

After data to be modified or added are written in such a manner, the flash memory controller 300 causes the data written into the block into which the data have been previously written to be deleted (S577).

Furthermore, it is determined whether errors have occurred during the data write operation, and then, an error recovery operation is made depending on the determination result.

4. Error Recovery Operation Process

The error recovery operation process is to detect error occurrence and perform data recovery, in the case where errors have occurred due to sudden power cutoff during the data write operation.

Such an error recovery operation is largely divided into the following cases: a case where power cutoff occurs in the process of updating the mapping information of the BIT 133 or the TC 135 during the process of performing a write operation requested by the processor 500; and a case where power cutoff occurs in the process of writing data input from the processor 500 into a corresponding physical address during the write operation process.

According to the error recovery operation of the present invention, in order to perform error recovery, it is first determined whether errors have occurred during the process of updating the mapping information, and the mapping information is then recovered. Thereafter, it is also determined whether the errors have occurred during the process of writing the data, and the data are then recovered.

In a case where electrical power is suddenly cut off, all errors or data that occurred during the process of writing the mapping information and during the process of writing the data are determined and recovered.

Figure 11:
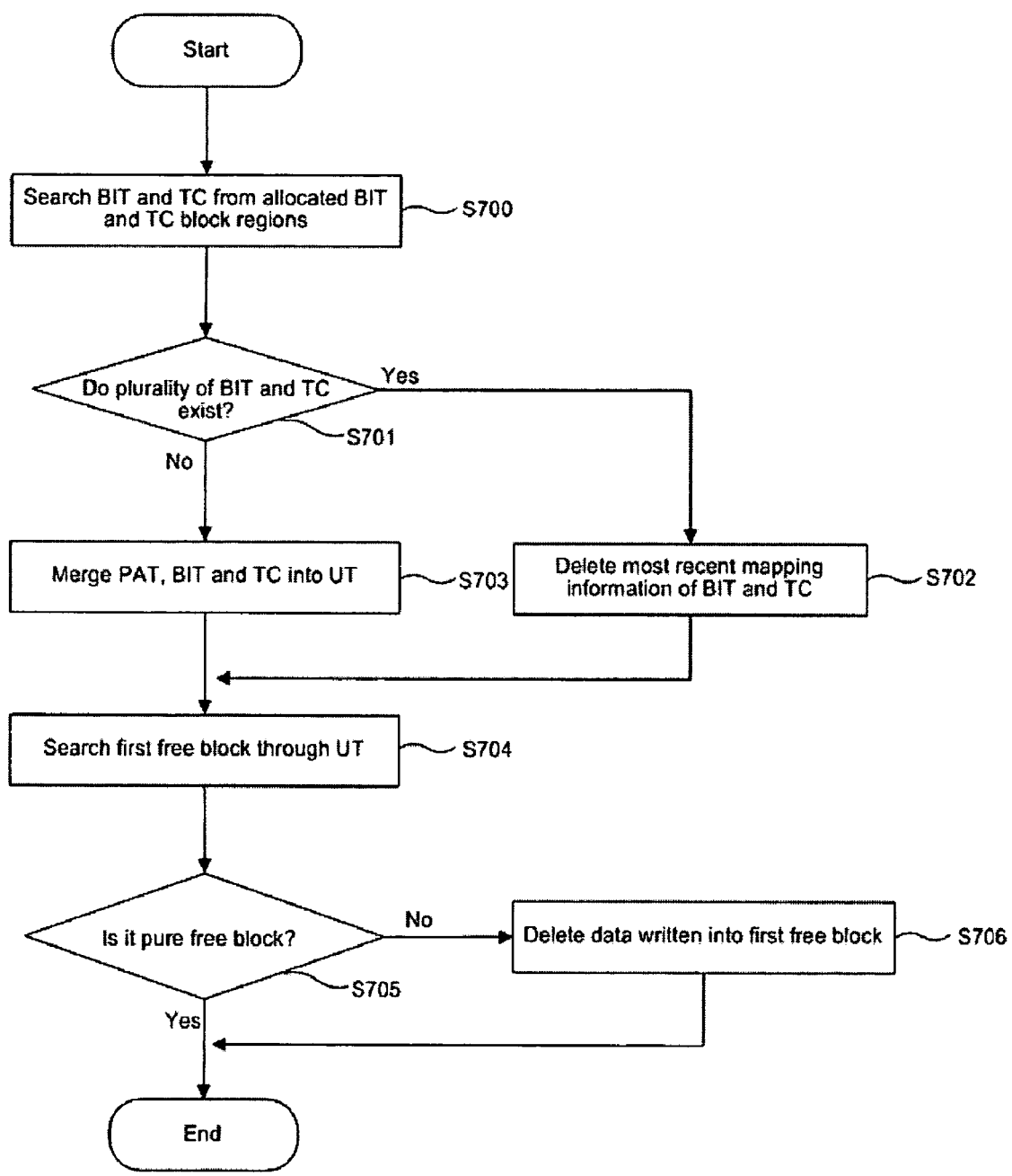
FIG. 11 is a flowchart of the process of performing an error recovery operation according to the flash memory access method of the present invention.

FIG. 11 is a flowchart of the operation process for the error recovery according to the flash memory access method of the present invention.

As shown in FIG. 11, the BIT 313 and the TC 315 obtained from the map block 130 are first checked (S700) to determine whether a plurality of the BIT 133 and the TC 135 exist within all the BIT/TC block regions including the BIT spare 134 and the TC spare 136 (S701).

As the result of the determination, if the plurality of the BIT 133 and the TC 135 exist, it is determined as the status where the mapping information is written into BIT spare 134 and the TC spare 136 since the errors were generated due to the power cutoff during the process of updating the mapping information.

In such a case, in order to recover the errors on the mapping information due to sudden power cutoff, the most recent one of the mapping information written into the BIT 133 and the TC 135 is deleted. Then, the BIT 133 and the TC 135 from which the most recent mapping information is removed and the PAT 131 obtained from the map block 130 are merged into the UT 137 created by the flash memory controller 300 during the initialization process (S702).

On the contrary, if only one BIT 133/TC 135 exists, the searched BIT 133/TC 135 and the PAT 131 obtained from the map block 130 are merged into the UT 137 created by the flash memory controller 300 during the initialization process (S703).

Through the above process, it is confirmed as to whether errors have occurred in the process of updating the mapping information and the errors on the mapping information are then recovered. Next, it is searched whether the data are written into the first free block of the UT 137 through the UT 137 (S704).

Through the search result for the first free block of the UT 137, it is determined whether the first free block is a pure free block (S705). As the result of the determination, if the first free block is not a pure free block, the data written into the first free block are deleted (S706).

According to the process, it is possible to detect the errors occurring in the process of performing a write operation requested by the processor 500 and to recover the corresponding data.

Further, the error recovery operation process can be performed at any time according to the control by the flash memory controller 300 as well as during the process of initializing the flash memory by power applied after the power is suddenly cut off.

Figure 12C:
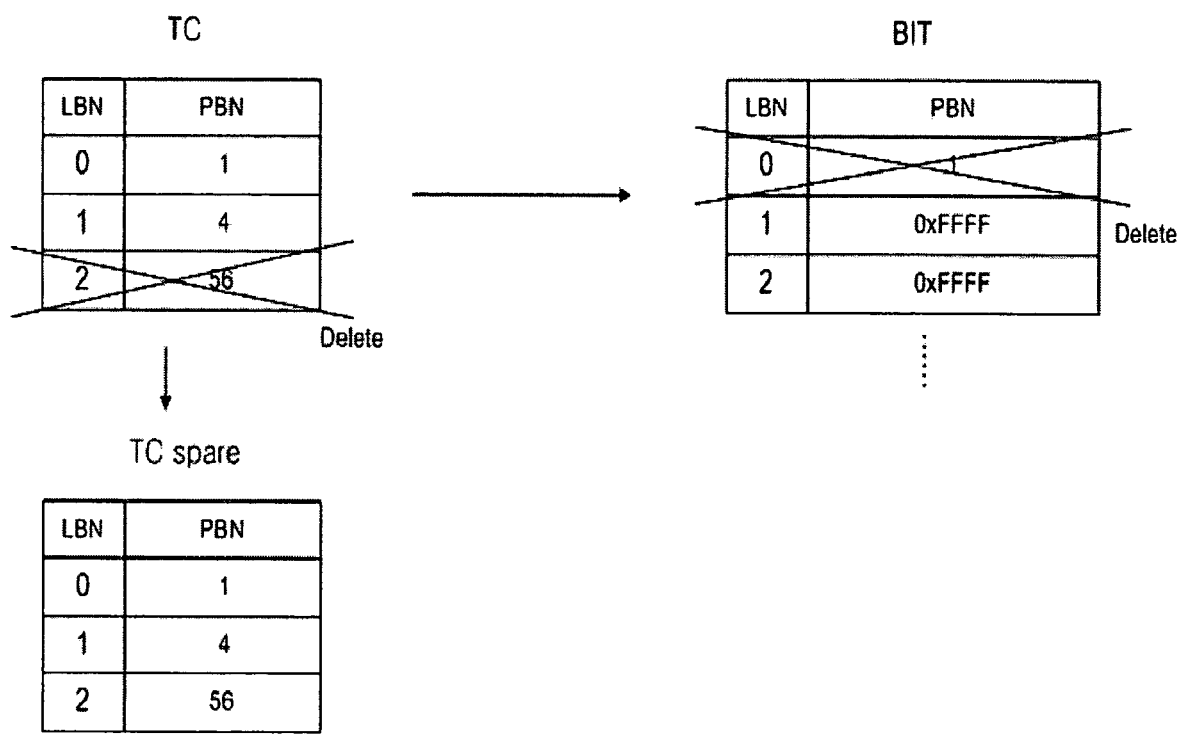

FIGS. 12a to 12c illustrate error recovery procedures in the mapping information update process among the error recovery process according to the present invention. FIG. 12a shows an initial state before the mapping information of the BIT 133 and the TC 135 is updated, FIG. 12b shows a state where the power is cut off during the process of updating the mapping information of the TC 135 to the BIT 133 by the new mapping information, and FIG. 12c shows a state where power is applied and the initialization process has been performed.

As shown in FIG. 12a, the mapping information that is changed by the write or erase operation requested by the processor 500 is written into the TC 135. During the process, if mapping information of LBN(2) is updated by the mapping information that is newly created by the write operation requested by the processor 500, new mapping information is written into LBN(2) of the TC 135, as shown in FIG. 12b.

If only three mapping information can be specified and stored in the TC 135, the mapping information is updated into the BIT 133 since the mapping information written into the TC 135 reached the specified value.

In order to update the mapping information of the TC 135 with the BIT 133, the current mapping information is first written into TC spare 136 serving as a spare block and the mapping information is then updated into the BIT 133, as shown in FIG. 12b.

If power is suddenly cut off after the data is written into LBN(0) of the BIT 133 according to such a mapping information update process, the data write operation is stopped at the current state.

Next, if power is applied again, the flash memory controller 300 causes the flash memory to be initialized, and the PAT 131, the BIT 133 and the TC 135 are detected.

If the initialization process is performed, the flash memory controller 300 searches for the BIT and TC block regions allocated to the map block 130 in order to detect and recover the errors due to sudden power cutoff.

As the result of the search, if the BIT 133, the TC 135 and the TC spare 136 are searched as shown in FIG. 12*c*, it is deemed that the plurality of mapping information corresponding to the TC 135 have been searched. Thus, the flash memory controller 300 determines that errors have occurred due to power cutoff and then deletes the most recent mapping information written into the BIT 133 and the TC 135 in order to recover the mapping information error.

Accordingly, the PBN written into LBN(0) of the BIT 133 is deleted and the PBN written into LBN(2) of the TC 135 is also deleted.

Through the above process, data errors that occurred in the process of updating the mapping information generated by the write operation requested by the processor 500 are recovered.

Figure 13A:
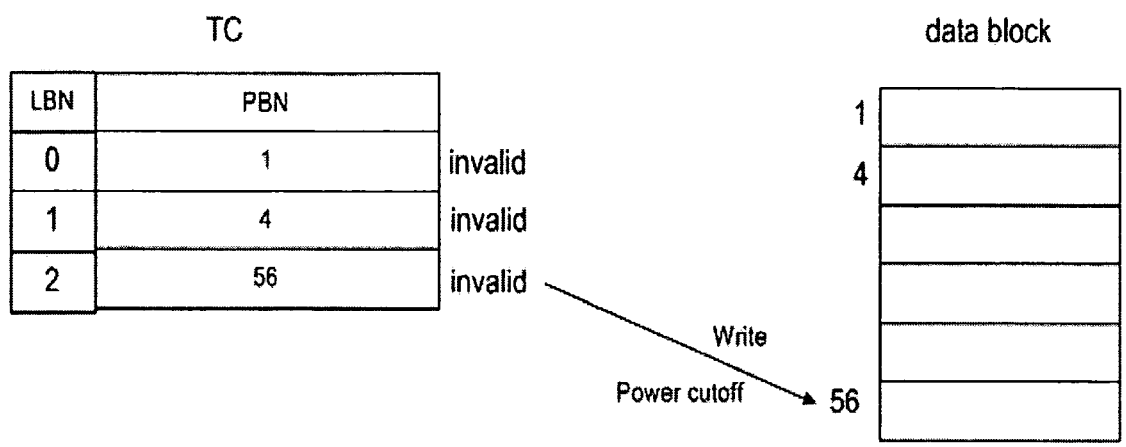
FIGS. 13a and 13b illustrate a process of recovering errors occurring in a data recording process according to one embodiment of the present invention, in the form of a mapping table.
Figure 13B:
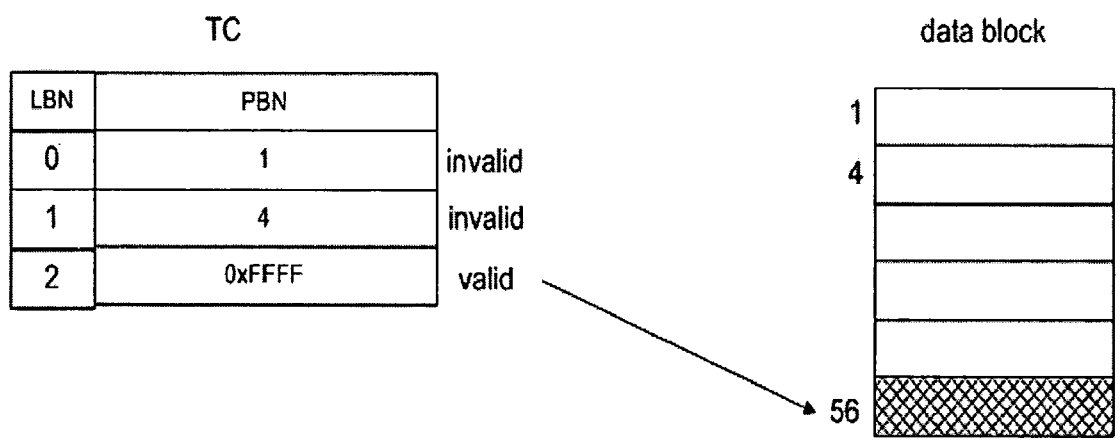

FIGS. 13*a* and 13*b* illustrate error recovery procedures in the data write process among the error recovery process according to the present invention. FIG. 13*a* shows a state where power is cut off during the process of writing the data, and FIG. 13*b* shows a state of the mapping table and the data block after power is applied.

As shown in FIG. 13*a*, if the mapping information of LBN(2) is updated by the mapping information that is newly generated by the write operation requested by the processor 500, new mapping information is written into LBN(2) of the TC 135.

If the new mapping information is written into LBN(2) of the TC 135 as such, LBN(2) is specified as an invalid status ("invalid") since LBN(2) is a logical address that is currently used. Thus, the data input from the processor 500 starts to be written into a corresponding physical address '56'.

If power is suddenly cut off during the process, the data write operation is stopped. After power is applied again, the initialization process is resumed.

If the TC 135 is read according to the initialization process, LBN(2) of the TC 135 is specified as a valid status ("valid") since the data write operation is stopped, as shown in FIG. 13*b*.

In the flash memory controller 300, either the PAT 131, the BIT 133 and the TC 135 that are read in the initialization process or the PAT 131 that is read in the initialization process, and the BIT 133 and the TC 135 from which the new mapping information is deleted are merged into the UT 137. Further, the first free block ("valid") of the UT 137 is checked. Then, it is checked that the previously written physical addresses exist.

Therefore, in order to recover the error block, the flash memory controller 300 deletes the data written into the corresponding data block 150 by using the physical address written into PBN(2) specified as the first free block.

Further, if power is applied again after it is suddenly cut off, the flash memory controller 300 can detect and recover the errors in the re-mapping process and in the data write process due to the write or delete operation requested by the processor 500.

According to the present invention, there is an advantage in that the data block from or into which the data will be read or written can be efficiently accessed by referring to the mapping table containing the status information of the data block when accessing the flash memory.

Further, there is another advantage in that an error block produced by the sudden power cutoff can be detected and effectively recovered.

Accordingly, an effect that the stability of the flash memory can be maximized is also obtained.

Although the present invention has been described in connection with the exemplary embodiments thereof shown in the accompanying drawings, they are mere examples of the present invention. It can also be understood by those skilled in the art that various changes and equivalents thereof can be made thereto without departing from the scope and spirit of the present invention defined by the claims. Therefore, the true technical scope of the present invention should be defined by the technical spirit of the appended claims.

What is claimed is:

1. A method for accessing a flash memory having a first mapping table containing a physical address of a data block read from the flash memory, comprising the steps of:

receiving a logical address along with a command if read and write operations are requested by a processor;

checking the logical address in a second mapping table containing mapping information, from which error blocks are excluded, of physical address information of the data block read from the flash memory and a third mapping table containing the most recent mapping information, in order to perform the read and write operations; and accessing the physical address of a specified data block and performing the read and write operations, when the logical address exists within the second and third mapping tables.

2. The method as claimed in claim 1, further comprising the step of treating the read operation as an error, when the logical address does not exist within the second and third mapping tables.

3. The method as claimed in claim 1, further comprising the step of accessing a physical address of a free block allocated through a fourth mapping table containing free block information created by a flash memory controller and performing the write operation, when the logical address does not exist within the second and third mapping tables.

4. The method as claimed in claim 1, further comprising the step of initializing the flash memory by loading the mapping information for efficiently accessing the flash memory from a map block of the flash memory according to the operations requested by the processor.

5. The method as claimed in claim 4, wherein the step of initializing the flash memory comprises the steps of:

checking entire information on the flash memory containing stored information related to the first mapping table address information written into the specified block of the flash memory;

reading the first mapping table from the map block of the flash memory and reading the second and third mapping tables through respective second and third mapping table regions allocated to the map block;

logically merging the read first, second and third mapping tables to create a fourth mapping table and then storing the created fourth mapping table in a RAM; and waiting to perform the read or write operations requested by the processor.

6. The method as claimed in claim 5, wherein the step of reading the first mapping table comprises the steps of:

searching for the address information of the first mapping table from the specified block by using the stored information;

detecting the address information and searching the first mapping table from the first mapping table block region allocated to the flash memory so as to write the address information searched in the first mapping table into the specified block, if the address information exists, or searching the first mapping table block region so as to generate the first mapping table and then to write the address information generated in the first mapping table into the specified block, if the address information does not exists; and reading out the first mapping table from the flash memory by using the searched or generated address information.

7. The method as claimed in claim 1, further comprising the step of detecting errors due to power cutoff occurring during the write operation process and recovering data related to the errors.

8. The method as claimed in claim 7, wherein the step of detecting the errors and recovering the relevant data comprises the steps of:

checking the second and third mapping tables from the map block of the flash memory to determine whether a plurality of the second and third mapping tables currently used exist within the map block;

if the plurality of second and third mapping tables exist in the map block, determining that the errors have occurred due to power cutoff during the process of updating the mapping information and deleting the most recent mapping information written into the second and third mapping tables;

merging the checked second and third mapping tables or the second and third mapping table with the most recent mapping information deleted therefrom and the first mapping table read out from the flash memory, into the fourth mapping table generated by the flash memory controller during an initialization process of the flash memory;

searching a first free block form the merged fourth mapping table and determining whether the searched free block is a pure free block into which no data are written; and if the searched free block is not the pure free block, determining that the errors have occurred due to power cutoff during the process of writing the data and deleting the written data.

9. The method as claimed in claim 1, wherein the read operation comprises the steps of:

receiving a given logical address for a data read, if the read operation is requested by the processor;

translating the given logical address into a physical address of the flash memory into which data is written, by referring to the second and third mapping tables;

determining in the translation step whether the given logical address is a valid address existing within the data block; and treating the read operation as a read error if the given logical address is not the valid address, or reading data written into the flash memory through the physical address and transmitting the read data to the processor if the given logical address is the valid address.

10. The method as claimed in claim 1, wherein the write operation comprises the steps of:

receiving a given logical address for a data write, if the write operation is requested by the processor;

determining whether the given logical address exists within the second and third mapping tables;

specifying an arbitrary block specified by a stepwise mapping scheme, if the given logical address exists, or searching for a free block allocated through a fourth mapping table containing free block information created by a flash memory controller as a physical address into which data will be written, if the given logical address does not exist;

writing the mapping information between the given logical address and the physical address into the third mapping table according to the specified physical address, and changing a pointer of the third mapping table indicating a use region according to the updated mapping information;

receiving data transmitted from the processor in a buffer and writing the input data into the physical address;

determining whether errors have occurred during the data write step; and if errors have occurred according to a result of the determination, writing a block corresponding to the physical address, as an error block, into the first mapping table containing the physical address of the data block read from the flash memory, changing the address information representing current mapping information to an address, into which the updated first mapping table is written, according to updated error information, and searching the free block to attempt to write the data.

11. The method as claimed in claim 10, further comprising the steps of:

allocating a new block for updating the mapping information of the third mapping table into the second mapping table and writing the mapping information of the second mapping table updated by the mapping information of the third mapping table into the allocated block, if a storage capacity of the mapping information of the third mapping table allocated to the flash memory is insufficient due to previous mapping information;

deleting the previous mapping information written into the third mapping table; and changing pointers of the respective second and third mapping tables indicating the use region, according to the mapping information that is updated or deleted.

12. The method as claimed in claim 10, further comprising the steps of:

allocating a new block for updating the mapping information of the third mapping table into the second mapping table and writing the mapping information of the second mapping table updated by the mapping information of the third mapping table into the allocated block, if storage capacities of the mapping information of the second and third mapping tables allocated to the flash memory are insufficient due to previous mapping information;

deleting the previous mapping information written into the second and third mapping tables; and changing pointers of the respective second and third mapping tables indicating the use region, according to the mapping information that is updated or deleted.

13. The method as claimed in claim 10, further comprising the steps of:

receiving data input from the processor in the buffer and then merging the input data and previously written data to write the merged data into the physical address, if the previously written data exists within the logical address; and deleting the data in the block into which the data was previously written, after the data write is completed.

14. The method as claimed in any one of claims 10 to 12, further comprising the step of storing the previous mapping information in second and third spare blocks of the respective second and third mapping tables, whenever the mapping information of the mapping tables are updated.

15. A flash memory having a map block, the map block comprising:
   a first mapping table containing a physical address allocated to a block of a plurality of blocks, wherein the plurality of blocks constitute a data block and status information of each of the plurality of blocks;
   a second mapping table containing mapping information between the physical address and a local address of each of the plurality of blocks in the first mapping table from which error blocks are excluded; and
   a third mapping table in which most recent mapping information is written and processed by a specified value to minimize an update operation of the second mapping table.

16. The flash memory as claimed in claim 15, wherein the map block further comprises a first, a second, and a third spare block for the respective first, second, and third mapping tables.

17. The flash memory as claimed in claim 16, wherein the second and third spare blocks store previous mapping information which is updated due to mapping information generated by write and delete operations.

18. The flash memory as claimed in claim 15, wherein the first mapping table includes physical block numbers for corresponding plurality of blocks and does not include logical block numbers, the second mapping table includes mapping information between the logical block numbers and the physical block numbers and the third mapping table includes at least one of the logical block numbers and at least one updated physical block number.

19. The flash memory as claimed in claim 15, wherein the first mapping table, the second mapping table, and the third mapping table are logically summed to obtain a fourth mapping table.

20. The flash memory as claimes in claim 19, wherein the fourth mapping table indicates free blocks and does not indicate used blocks.

21. A flash memory access apparatus, comprising:
   a flash memory including a first mapping table, a second mapping table, a third mapping table and respective first, second, and third spare locks, wherein the first mapping table contains a physical address information of a data block, the second mapping table contains mapping information of the first mapping table from which error blocks are excluded, and the third mapping table contains most recent mapping information; and
   a flash memory controller for generating a fourth mapping table containing free block information through the first, second and third mapping tables obtained from a map block in the flash memory, and for accessing respective physical addresses from and into which data will be read and written by referring to the second and third mapping tables in read operations and the fourth mapping table in write operations.

22. The flash memory access apparatus as claimed in claim 21, wherein the flash memory controller detects errors due to power cutoff during a data write process through the fourth mapping table and during a mapping information update process through the second and third mapping tables, and recovers data related to the errors.

* * * * *